US011515876B2

(12) United States Patent
Decock et al.

(10) Patent No.: US 11,515,876 B2
(45) Date of Patent: Nov. 29, 2022

(54) DRIVER FOR A SHARED BUS, IN PARTICULAR A LIN BUS

(71) Applicant: SOFICS BVBA, Gistel (BE)

(72) Inventors: Koen Jan Decock, Wingene (BE); Olivier Eugene A Gesquiere, Wakken (BE); Henk Roel Motte, Melle (BE); Wouter Faelens, Ghent (BE)

(73) Assignee: SOFICS BVBA, Gistel (BE)

( * ) Notice: Subject to any disclaimer, the term of this patent is extended or adjusted under 35 U.S.C. 154(b) by 0 days.

(21) Appl. No.: 17/419,046

(22) PCT Filed: Dec. 26, 2019

(86) PCT No.: PCT/EP2019/087045
§ 371 (c)(1),
(2) Date: Jun. 28, 2021

(87) PCT Pub. No.: WO2020/136222
PCT Pub. Date: Jul. 2, 2020

(65) Prior Publication Data
US 2022/0085810 A1    Mar. 17, 2022

(30) Foreign Application Priority Data

Dec. 28, 2018 (BE) .................................. 2018/5962

(51) Int. Cl.
*H03K 19/018* (2006.01)
*H03K 19/0185* (2006.01)
(Continued)

(52) U.S. Cl.
CPC . *H03K 19/018507* (2013.01); *H03K 19/0005* (2013.01); *H03K 19/12* (2013.01); *H03K 19/17744* (2013.01); *H03K 19/17784* (2013.01)

(58) Field of Classification Search
CPC ....... H03K 19/018507; H03K 19/0005; H03K 19/12; H03K 19/17744; H03K 19/17784
(Continued)

(56) References Cited

U.S. PATENT DOCUMENTS

2009/0243655 A1* 10/2009 Nascimento ........ G06F 13/4072
326/83
2010/0166085 A1   7/2010 Sicard
2014/0269996 A1   9/2014 Deval et al.

FOREIGN PATENT DOCUMENTS

WO    2007/135491 A1    11/2007

OTHER PUBLICATIONS

PCT/EP2019/087045 International Search Report, dated Jun. 25, 2020, 6 pgs.

* cited by examiner

*Primary Examiner* — Tomi Skibinski
(74) *Attorney, Agent, or Firm* — Volpe Koenig

(57) ABSTRACT

A driver for a shared bus, such as a LIN bus, having a supply node (Vbat), a bus node (LIN), a transmit data input node (TX) and a receive data output node (RX), said driver comprising: a pull-up circuitry between the supply node and the bus node, driver circuitry (100) having a control input connected to the transmit data input node, feedback circuitry (200) configured to provide feedback from the shared bus to the control input of the driver circuitry; said feedback circuitry comprising copy circuitry (210) configured to obtain at least one copy signal representative for a signal on the bus node, filter circuitry (220) configured to low-pass filter the at least one copy signal, derivative circuitry (230) configured to obtain at least one derivative signal representative for the speed at which the signal on the bus node varies.

26 Claims, 14 Drawing Sheets

(51) Int. Cl.
*H03K 19/00* (2006.01)
*H03K 19/12* (2006.01)
*H03K 19/17736* (2020.01)
*H03K 19/17784* (2020.01)

(58) Field of Classification Search
USPC .......................................................... 327/333
See application file for complete search history.

DRIVER FOR A SHARED BUS, IN PARTICULAR A LIN BUS

CROSS-REFERENCE TO RELATED APPLICATIONS

This application is the U.S. National Stage, under 35 U.S.C. § 371, of International Application No. PCT/EP2019/087045 filed Dec. 26, 2019, which claims the benefit of Belgium Application No. 2018/5962 filed Dec. 28, 2018, the contents of which are incorporated herein by reference.

FIELD OF INVENTION

The field of the invention relates to drivers for insertion between a shared bus, such as a Local Interconnect Network (LIN) bus, and a logic device.

BACKGROUND

The increase of communications in automotive applications led to the introduction of the LIN protocol besides the CAN protocol. The LIN (Local Interconnect Network) protocol is a cheap, low speed communication. Typically one master node and up to 16 slave nodes may be provided. The LIN protocol is specified in ISO standard ISO 17987 Part 1-7. Nowadays LIN is used not only in automotive applications but also in other industrial applications.

The LIN is a one-wire, low speed communication device (transmitter/receiver). The LIN wire can connect to 1 master and 16 slaves, so the exact load is not known. As shown in FIG. 1, the LIN wire 1 is coupled through a diode $D_{EXT}$ and resistor $R_{EXT}$ to the battery Vbat. In a recessive state the LIN wire 1 is pulled to a high voltage value near Vbat. During communication the LIN wire 1 will be pulled to ground GND; this state is called the dominant state. FIG. 2 illustrates the switching between the recessive state $S_R$ and the dominant state $S_D$. Typically, the circuitry is designed to avoid or limit interference and creation of unwanted RF signals (EMI and EMC). Fast switching between the recessive and dominant states should be avoided. Typically, the slope between the recessive and dominant states will be limited, e.g. around 5 µs as determined by the LIN standard mentioned above.

A typical LIN node with a LIN driver 2 is depicted in FIG. 1. The LIN driver 2 has a receiver connected to a receive data output pin RX and a transmitter M1 connected to a transmit data input pin TX. The receive data output pin RX and the transmit data input pin TX may be connected to a controller (not shown). The LIN driver 2 and the controller may be integrated in the same chip or may be provided as separate components. Externally to the chip a diode $D_{EXT}$ and a resistor $R_{EXT}$, e.g. having a value of 1 k Ohm, are provided to pull the LIN pin to the battery voltage Vbat when no communication is required (recessive state). Additionally, an internal diode D1 and a resistor R1, e.g. having a value of 30 k Ohm, are provided within the LIN driver 2. In that manner current flow is avoided when the LIN, GND, VBAT pins are miswired or when a loss of GND or BAT occurs. A MOSFET M1 is used as the transmitter. Further, the LIN driver 2 may comprise slope control circuitry for obtaining the required slope during transitions.

When a high frequency signal (Example: DPI (Direct power injection—IEC62132-4) test) is applied at the LIN pin, the signal could be coupled through the diode D2 to the gate of MOSFET M1. The gate voltage will be pulled higher than the required gate voltage due to the RF signal. This higher gate voltage will have an impact on the slope of the signal. To address this problem some prior art solutions use feedback circuitry between the LIN pin and the gate of the MOSFET M1. However, the known feedback circuitry typically has at least one of the following disadvantages: high energy consumption, high load on the LIN pin, unstable feedback.

US 2009/0243655 discloses a transceiver suitable for interfacing a logic device to a shared bus. The transceiver includes a transmit node that receives an input signal from the logic device and an I/O node, that is coupled to the shared bus. The transceiver may be designed for use with a shared-bus, single master, multiple slave architecture, e.g., a Local Interconnect Network (LIN). The driver current may cause a sinusoidal transition of the shared bus voltage. The transceiver comprises a slew time module which is connected to a shared bus through a low pass filter element. The slew time module asserts a first 70% output when the VLIN drops below approximately 70% of VBAT and a second 40% output when the VLIN drops below approximately 40% of VBAT. The implementation presented in US 2009/0243655 is rather complex and requires a look-up table to obtain an appropriate bias signal.

WO2007135491 discloses a LIN network comprises a transmit driver for communicating on a single communication bus. A slope control module is operably coupled to a supply voltage and in the case of voltage transition controls the transmit driver to selectively apply one of: a first voltage transition mode comprising a constant DV/DT slope transition, or a second voltage transition mode comprising a fixed time transition, on the base of the supply voltage detected.

SUMMARY

The object of embodiments of the invention is to provide a driver for a shared bus with improved feedback circuitry.

According to a first aspect of the invention, there is provided a driver for insertion between a shared bus, such as a Local Interconnect Network (LIN) bus, and a logic device. The driver has a supply node for connection to a voltage supply, a bus node for connection to the shared bus, a transmit data input node and a receive data output node. The driver comprises a pull-up circuitry between the supply node and the bus node, driver circuitry, and feedback circuitry. The driver circuitry is configured to draw a current from the shared bus in function of a signal on the transmit data input node. The driver circuitry may also be called transmitter circuitry as it will fulfill the transmitting function of the driver. The driver circuitry has a control input connected to the transmit data input node. The feedback circuitry is configured to provide feedback from the shared bus to the control input of the driver circuitry. The feedback circuitry comprises copy circuitry, filter circuitry and derivative circuitry. The copy circuitry is configured to obtain at least one copy signal representative for a signal on the bus node. The filter circuitry is configured to low-pass filter the at least one copy signal to obtain at least one filtered signal. The derivative circuitry is configured to obtain at least one derivative signal representative for the speed, i.e. the rate, at which the signal on the bus node varies based on the at least one filtered signal.

Such feedback circuitry has the advantage that it can be implemented in a simple and robust manner, and that the energy consumption can be substantially independent of the bus load and can be low compared to prior art solutions. Indeed, the copy circuitry can provide a high impedance copy allowing limiting the energy consumption. Embodiments of the invention allow reducing both the energy consumption on the bus as well as the total energy consumption. By including filter circuitry any high frequent disturbances can be filtered out of the at least one copy signal. Using derivative circuitry to provide feedback to the control input of the driver circuitry will allow for an accurate adjustment of the control input with a limited amount of energy consumption.

Preferably, the derivative circuitry is configured to obtain the at least one derivative signal by performing a derivation in time of the at least one filtered signal. Preferably, the output of the derivative circuit is a current or a voltage of which the value depends on the slope of the signal on the bus node. Preferably, the derivative circuitry is configured to obtain the at least one derivative signal in a continuous manner whilst in operation.

According to an exemplary embodiment, the pull-up circuitry comprises a diode and a resistor connected in series between the supply node and the bus node. In that way the driver can be made compliant with the above mentioned LIN standard. However, e.g. when the driver has to be compliant with another standard, also other pull-up circuitry may be envisaged.

According to an exemplary embodiment, the driver further comprises mixing circuitry configured to mix the at least one derivative signal with an input signal representative for a signal on the transmit data input node, in order to provide a corrected signal to the control input of the driver circuitry. The input signal may be a positive or a negative current depending on a level of the signal on the transmit data input node. Such mixing circuitry can be easily implemented using circuitry with limited energy consumption According to an exemplary embodiment, the feedback circuitry is connected to the receive data output node such that the at least one filtered signal or a signal representative for said at least one filtered signal is provided at the receive data output node. In other words a part of the feedback circuitry can have a "double" function being on the one hand the providing of feedback to the control input of the driver circuitry, and on the other hand the conversion of a signal on the bus node into a suitable signal for use at the receive data output node. In that way, the driver will be more compact and the load and leakage at the shared bus will be limited. The feedback circuitry may be connected to the receive data output node through receiver circuitry.

According to an exemplary embodiment, the driver circuitry comprises a series connection of a low voltage transistor, a high voltage transistor and a diode, wherein the low voltage transistor has the control input. This will allow carrying off an RF interference signal to a control input of the high voltage transistor such that the impact of such signal on the control input of the low voltage transistor is limited. The low voltage transistor may be a low voltage MOSFET, and the high voltage transistor may be a high voltage MOSFET. The gate of the high voltage MOSFET may be connected to a DC voltage supply. This DC supply voltage is different from the supply voltage connected to the supply node of the driver. The DC supply voltage may be e.g. a 5V DC supply voltage. The DC supply voltage may be generated based on the supply voltage connected to the supply node of the driver (this supply voltage will typically be a battery voltage, e.g. between 5V and 20V). Alternatively, the DC supply voltage may originate from a separate power source. More preferably, the gate of the high voltage MOSFET may be coupled to a push-pull circuit between the supply node and the ground. In that manner an additional direct power injection (DPI) shielding is obtained. Further, the low voltage transistor can be faster than the high voltage transistor. Typically the high voltage transistor will be capable of withstanding higher voltages than the low voltage transistor. For example, the high voltage transistor will be capable of supporting voltages higher than 5 V. The push-pull circuit may be set by the DC voltage supply. Even more preferably, the control input of the high voltage transistor, i.e. the gate in case of a HV MOSFET, may be connected to a capacitor configured to drain away any additional RF power to ground. Optionally, a diode may be provided between the gate of the HV MOSFET and an intermediate node between the HV MOSFET and the LV MOSFET, wherein the diode is connected such that it conducts in a forward direction from the intermediate node to the gate. This will ensure a safe operating area of the LV MOSFET during an off-state thereof.

According to an exemplary embodiment, the copy circuitry comprises at least one current mirror circuit. The copy circuitry may comprise a first current mirror with a first branch between the bus node and the supply node and a second branch generating a first mirror current, and a second current mirror with a first branch between the bus node and a ground node and a second branch generating a second mirror current, and the filter circuitry may then be configured for filtering both the first and the second mirror current to obtain a first and a second filtered signal. In that way, a good copy can be obtained regardless of the state of the bus node and the impact on the shared bus e.g. in terms of load and leakage will be limited.

According to an exemplary embodiment, the copy circuitry is configured such that a leakage current flowing from the bus node into the copy circuitry is less than 20 microampere, and/or such that an equivalent capacitance of the copy circuitry as seen from the bus node is less than 250 pF. In that manner, a signal on the bus node will not be disturbed significantly by the copy circuit.

According to an exemplary embodiment, the copy circuitry is configured to sense a voltage on the bus node and to cause a transition thereof into at least one copy current constituting the at least one copy signal, using a resistor between the supply node and the bus node and/or using a resistor between the bus node and the ground.

According to a second aspect of the invention there is provided a driver for insertion between a shared bus, such as a Local Interconnect Network (LIN) bus, and a logic device. The driver has a supply node for connection to a voltage supply, a bus node for connection to the shared bus, a transmit data input node and a receive data output node. The driver comprises a pull-up circuitry between the supply node and the bus node, a driver circuitry, and feedback circuitry. The driver circuitry is configured to draw a current from the shared bus in function of a signal on the transmit data input node. The driver circuitry has a control input connected to the transmit data input node. The feedback circuitry is configured to provide feedback from the shared bus to the control input of the driver circuitry. The feedback circuitry comprises filter circuitry configured to low-pass filter at least one signal representative for a signal on the bus node to obtain at least one filtered signal. The feedback circuitry is connected to the receive data output node such that the at least one filtered signal or a signal representative for said at least one filtered signal is provided at the receive data output node.

This aspect has the advantage that a part of the feedback circuitry can have a "double" function being on the one hand the providing of feedback to the control input of the driver circuitry, and on the other hand the conversion of a signal on the bus node into a suitable filtered signal for use at the receive data output node. In that way, the driver will be more compact and the impact on the shared bus e.g. in terms of load and leakage will be limited.

Also, according to the second aspect, preferably, the driver further comprises derivative circuitry configured to obtain at least one derivative signal representative for the speed at which the signal on the bus node varies based on the filtered at least one signal. Also, the driver further may comprise mixing circuitry configured to mix the at least one derivative signal with a signal on the transmit data input node to provide a corrected signal to the control input of the driver circuitry. However, as an alternative to derivative circuitry and/or a mixing circuitry, also other circuitry may be used in the feedback loop.

Also, according to the second aspect, preferably, the feedback circuitry further comprises copy circuitry configured to obtain at least one copy signal representative for a signal on the bus node, and connected to provide said at least one copy signal to an input of the filter circuitry.

The preferred features below apply both for the first and second aspect.

According to an exemplary embodiment, the filter circuitry comprises a low-pass filter and at least one of: a pre-filter shaping circuit between the copy circuitry and the low-pass filter, a post-filter shaping circuit between the low-pass filter and the derivative circuitry. The receive data output node may be connected to an output of the low-pass filter or to an output of the post-filter shaping circuit. The pre-filter shaping may be a current or voltage shaping, depending on whether the copy signal is a current or voltage signal. Also, the post-filter shaping may be a current or voltage shaping, depending on whether the signal to be post-shaped is a current or voltage signal. Preferably, the pre-filter shaping circuit is configured to adapt a current or voltage range of the at least one copy signal into a current or voltage range which is optimised for the low-pass filter. Similarly, the post-filter shaping circuit may be configured to adapt a current or voltage range of the at least one signal output by the low-pass filter into a current or voltage range which is optimised for the derivative circuitry.

The feedback circuitry may be connected to the receive data output node through receiver circuitry. Optionally, a further current or voltage shaping circuit may be provided between the receiver circuitry and the filter circuitry. In that way, a range of a signal output by the feedback circuitry may be further optimised for the receiver circuitry.

In exemplary embodiments of the invention, the receiver circuitry may comprise any one or more of the following: an inverter circuit, an op-amp circuit, a Schmitt trigger circuit.

According to an exemplary embodiment, the copy circuitry is configured to obtain at least one copy current signal representative for a signal on the bus node, and the feedback circuitry comprises a current-to-voltage converter configured to convert the at least one copy current signal into at least one voltage signal. The current-to-voltage converter may be arranged between the filter circuitry and the derivative circuitry or between the copy circuitry and the filter circuitry.

According to an exemplary embodiment, the derivative circuitry comprises a first derivative circuitry configured to obtain a first derivative signal representative for a rising slope of the signal on the bus node based on the at least one filtered signal, and a second derivative circuitry configured to obtain a second derivative signal representative for a falling slope of the signal on the bus node based on the at least one filtered signal. In that manner, both in the event of a rising slope and a falling slope, an accurate feedback-mechanism is provided.

According to an exemplary embodiment, the feedback circuitry is implemented in MOS technology.

According yet another aspect, there is provided a local interconnect network comprising a shared bus and a plurality of drivers comprising at least one driver according to any one of the embodiments defined above, wherein each driver is connected with its bus node to the shared bus. One driver of said plurality of drivers may be configured to function as a master, and one or more other drivers thereof may be configured to function as one or more slaves. It is noted that one or more drivers according to embodiments of the invention may be combined with one or more other drivers, e.g. drivers of the state of the art. For example, only the master driver could be a driver according to an embodiment of the invention, or only one or more slave drivers could be according to an embodiment of the invention.

BRIEF DESCRIPTION OF THE FIGURES

The accompanying drawings are used to illustrate presently preferred non-limiting exemplary embodiments of devices of the present invention. The above and other advantages of the features and objects of the invention will become more apparent and the invention will be better understood from the following detailed description when read in conjunction with the accompanying drawings, in which.

DESCRIPTION OF EMBODIMENTS

Figure 3A:
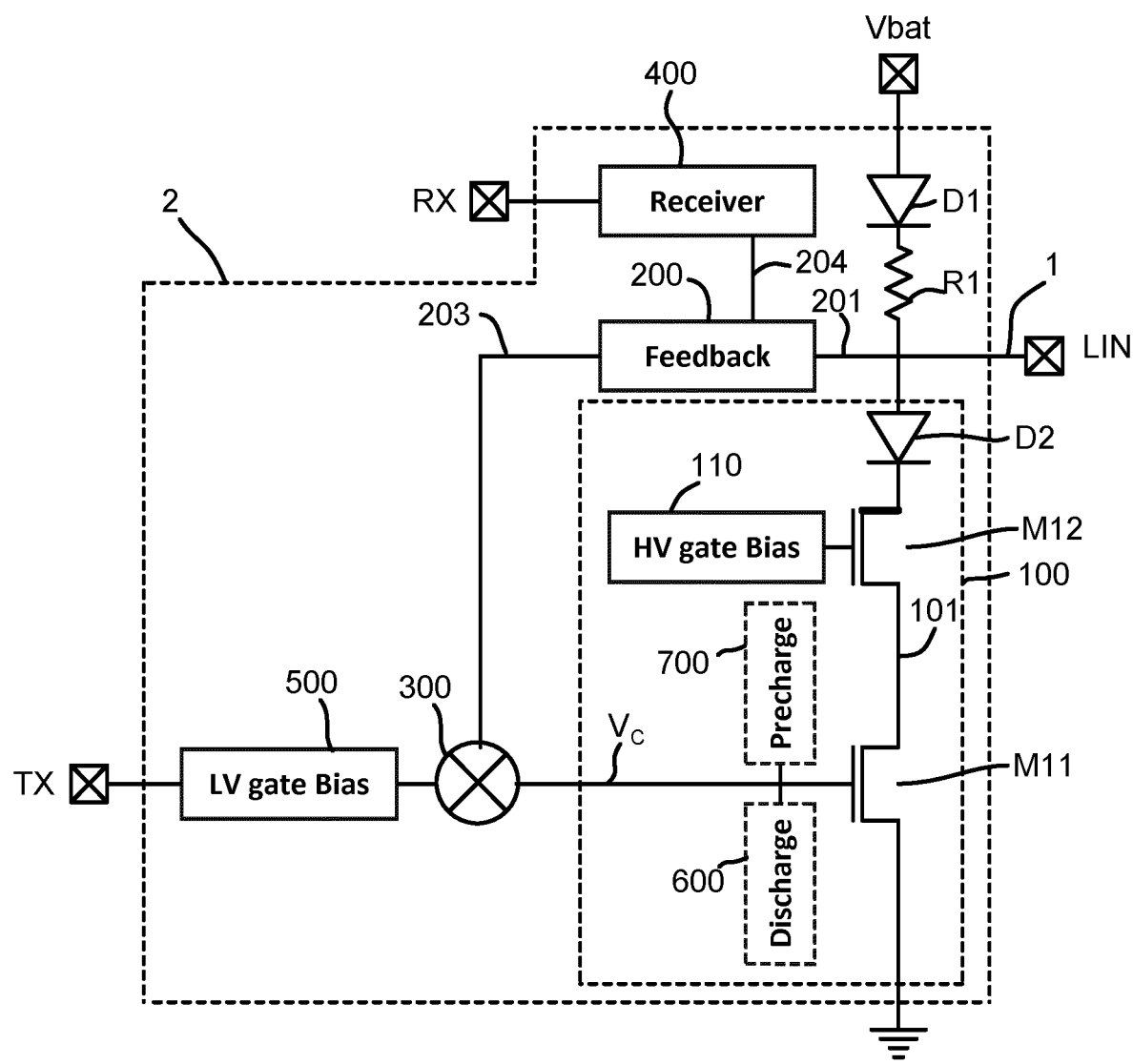
FIGS. 3A and 3B are circuit diagrams of two exemplary embodiments of a driver according to the invention.

FIG. 3A depicts a circuit diagram providing a general overview of an exemplary embodiment of a driver 2, typically a LIN driver, also called LIN transceiver.

The driver 2 is inserted between a shared bus 1, such as a Local Interconnect Network (LIN) bus, and a logic device (not shown). The driver 2 having a supply node Vbat for connection to a voltage supply, a bus node LIN for connection to the shared bus, a transmit data input node TX and a receive data output node RX. The driver 2 comprises a pull-up circuitry comprising a diode D1 and a resistor R1 connected in series between the supply node Vbat and the bus node LIN. The series resistor R1 may have a value between 10 kOhm and 100 kOhm, e.g. more or less 30 kOhm. The diode D1 and resistor R1 may be as specified in the LIN specifications/standard.

Figure 1:
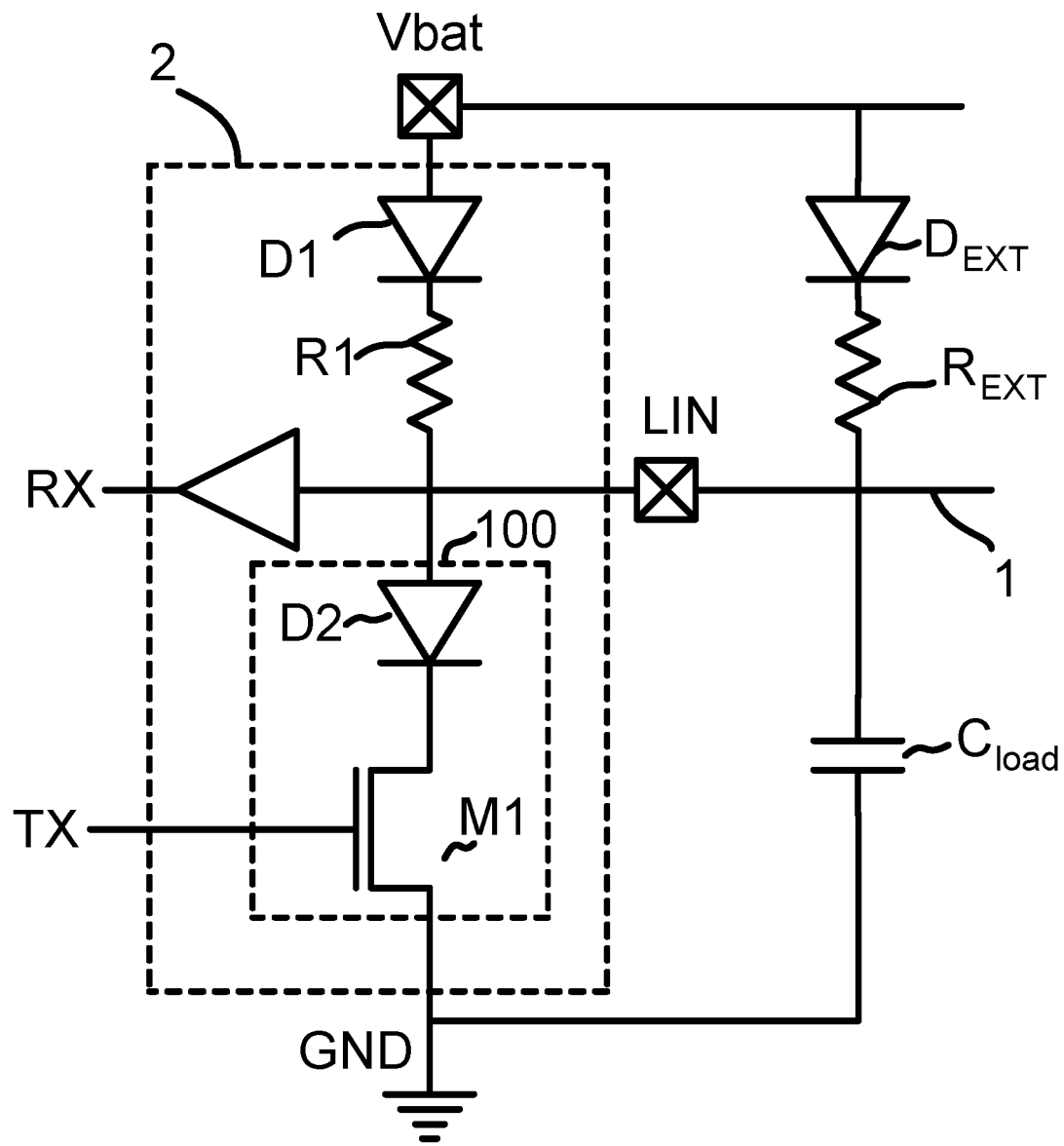
FIG. 1 is a circuit diagram of a LIN driver according to the prior art.
Figure 2:
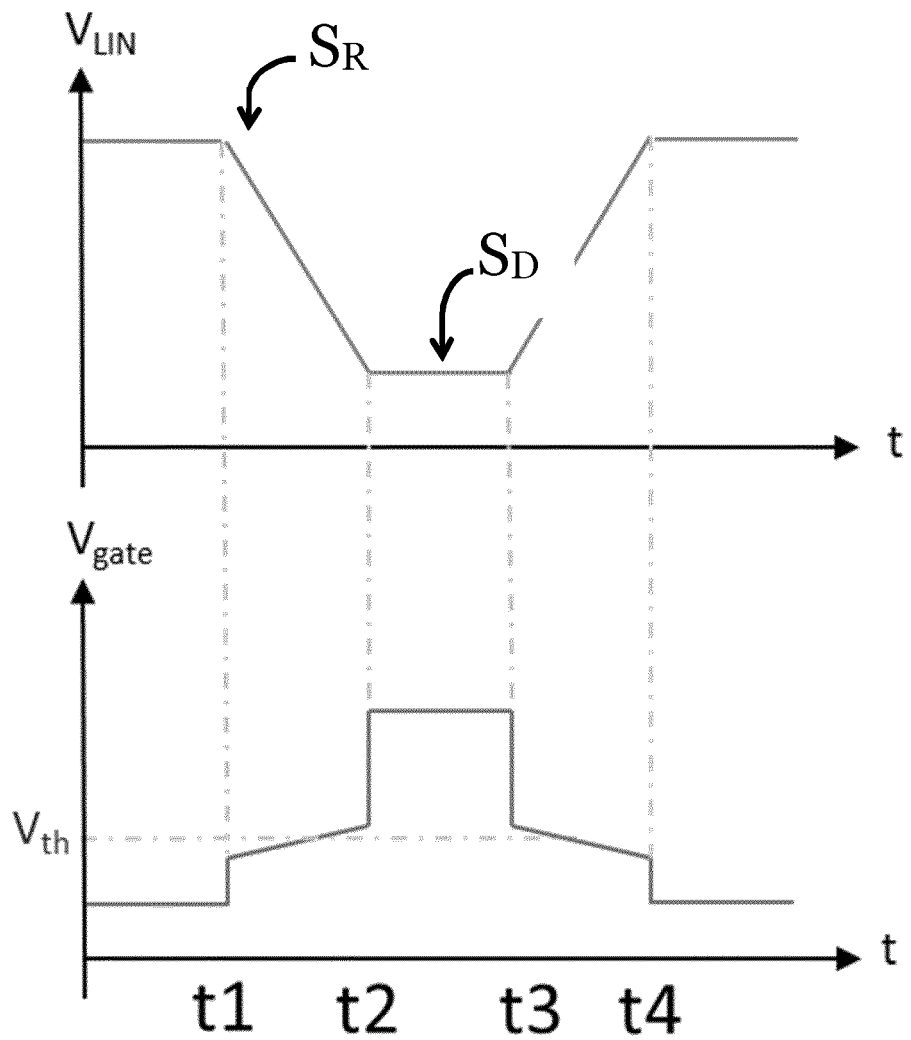
FIG. 2 is a schematic time diagram plotting the voltage ($V_{LIN}$) on the LIN node and the voltage ($V_{gate}$, also called $V_c$ in the description below) on the gate of the transistor M1, in function of time.

The driver 2 further comprises driver circuitry 100 and feedback circuitry 200. The driver circuitry 100 is configured to draw a current from the shared bus 1 in function of a signal on the transmit data input node TX. The driver circuitry 100 has a control input Vc (called $V_{gate}$ in FIG. 2) connected to the transmit data input node TC. The feedback circuitry 200 is configured to provide feedback from the shared bus LIN to the control input Vc of the driver circuitry 100.

The driver circuitry may comprise a LV NMOS device M11 with in series a HV NMOS device M12 and a diode D2, and a HV gate bias circuit 110 connected to the gate of the HV NMOS device M12. The LV NMOS device M11 is designed to provide a current to pull the bus node LIN towards ground, i.e. to bring the driver 2 in the dominant state $S_D$, see also FIG. 2. The HV NMOS device M12 is used to block the high voltages on the bus node LIN. The LV NMOS device M12 may be e.g. from a 1.8V, 2.5V, 3.3V, or 5V power domain. However, also other power domains are possible. In typical embodiments, the maximum voltage on the bus node LIN may go up to 40V, which is much higher than the maximum allowed voltage for the LV NMOS device M11, so the HV NMOS device M12 will limit the voltage at the drain 101 of the LV NMOS M11 device to the voltage defined by the HV gate bias circuit 110. Normally this will be the voltage where the LV NMOS device M11 is designed for. In typical embodiments, the voltage on the bus node LIN may go also below ground, down to −27V. The additional diode D2 in the driver circuitry 100 will block current flow for negative voltages.

The control input Vc of the driver circuitry 100, here the gate of the LV MOS M11, is controlled by a LV gate bias circuit 500. The LV gate bias circuit 500 will, based on a signal on the transmit data input node TX, provide a positive or negative current to the gate Vc of the LV MOS M11 to charge or discharge the gate node. The current applied to gate of the LV MOS M11 is controlled, so the output signal $V_{LIN}$ on the bus node LIN will have a pre-defined slew rate. Preferably, the slew rate is limited to prevent disturbances on the shared bus 1.

During normal operation, the shared bus 1 may be disturbed by RF signals. These RF signals may be coupled to the gate Vc of the LV NMOS M11 through the drain-gate capacitance of the LV NMOS M11. This coupling will pull the gate Vc to a voltage higher than desired, resulting in a shorter slew rate of the signal $V_{LIN}$. A possible test to simulate and measure this effect is the DPI test (direct power injection). Changes in the battery voltage Vbat, temperature, loads on the shared bus 1, will have also an impact on the shape of the output signal $V_{LIN}$ on the shared bus 1.

To correct the output signal $V_{LIN}$ during such disturbance event, a feedback circuitry 200 is provided. This feedback circuitry 200 will investigate the output signal $V_{LIN}$ and provide a correction to the current provided by the LV gate bias 500. To that end a mixing circuitry 300 is provided for mixing an input signal output by the LV gate bias 500 and a feedback current output by the feedback circuitry 200. This feedback circuitry 200 is configured to copy the signal $V_{LIN}$ on the bus node, to filter it and to perform a derivation (in time) to the filtered signal. A current proportional to the derived signal will be provided to the mixing circuitry 300 in order to adjust the gate voltage Vc. The feedback circuitry 200 may be implemented in MOS technology. More details about possible embodiments of the feedback circuitry 200 will be provided below with reference to FIGS. 4-12. The mixing circuitry 300 is configured to mix the at least one derivative signal with the input signal which is output by the LV gate bias 500 and which is representative for a signal on the transmit data input node TX, and to provide a corrected signal Vc to the control input of the driver circuitry 100. The input signal which is output by the LV gate bias 500 may a positive or a negative current depending on a level of the signal on the signal on the transmit data input node TX.

Figure 3B:
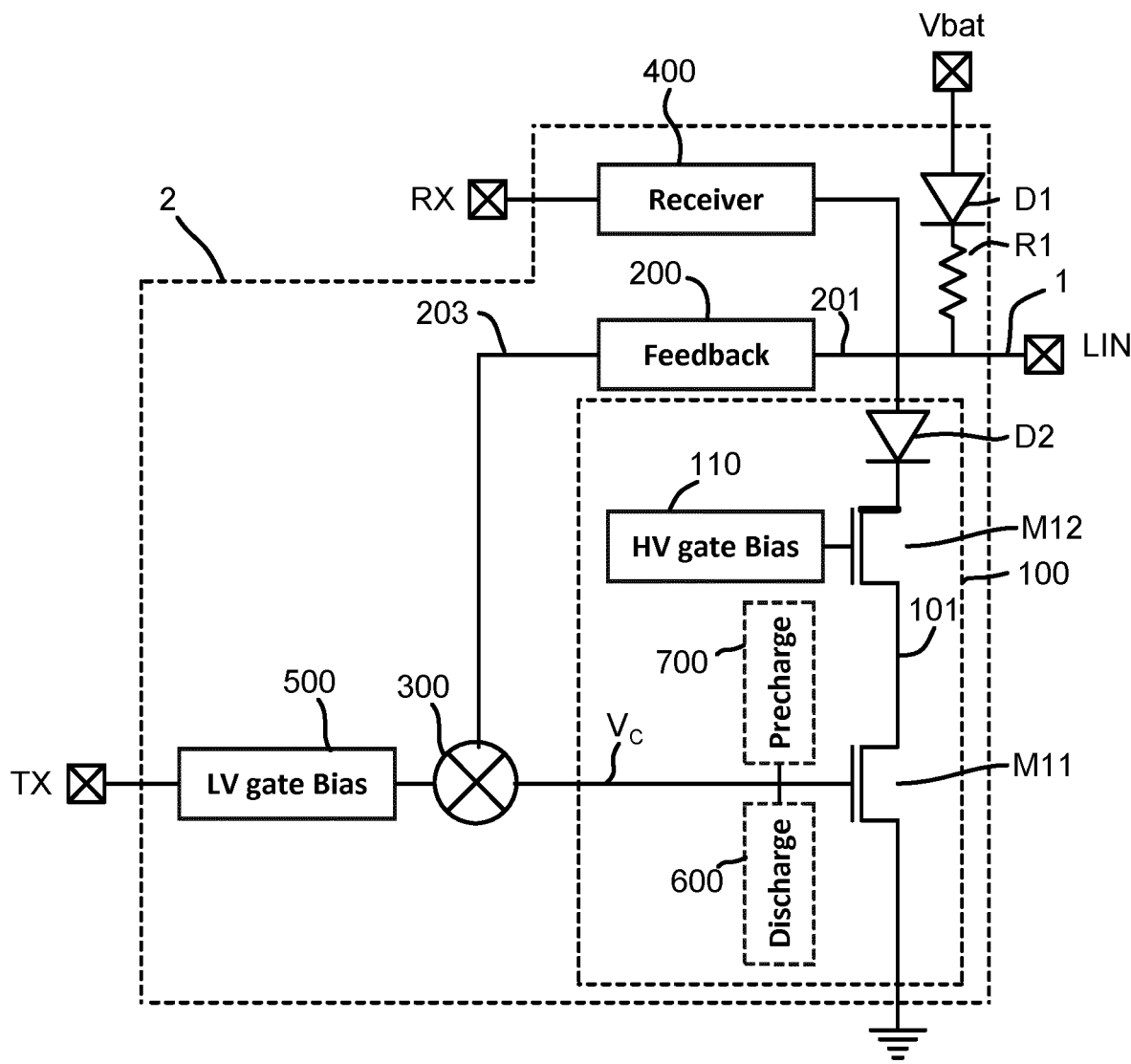

As illustrated in FIG. 3A, the driver 2 further comprises receiver circuitry 400. The receiver circuitry 400 may comprise e.g. an inverter circuit, an op-amp circuit, a Schmitt trigger circuit, or a combination thereof. The receiver circuitry 400 is connected to the feedback circuitry 200. The feedback circuitry 200 is connected to the receive data output node RX such that the filtered at least one signal or a signal representative for said at least one filtered signal is provided through the receiver circuitry 400 at the receive data output node RX. This will prevent that the signal on the bus node LIN must be filtered twice and this will also limit the load to the bus node LIN. However, in another embodiment illustrated in FIG. 3B, the receiver circuitry 400 may include a filter, and the receiver circuitry 400 is directly connected to the bus node LIN. The other components of the circuit of FIG. 3B are identical to those of FIG. 3A and reference is made to the description above and below.

Optionally discharge circuitry 600 and/or pre-charge circuitry 700 may be added. The pre-charge circuitry 700 may help in two ways. When the signal $V_{LIN}$ goes from the recessive state $S_R$ to dominant state $S_D$, the control input Vc of the driver 2 is charged so that the control voltage Vc will be around the threshold $V_{th}$ (time between t1 and t2, see FIG. 2). The pre-charge circuitry 700 may provide additional current to go faster from 0V to the threshold voltage $V_{th}$ (see t1 in FIG. 2). Secondly, the pre-charge circuitry 700 may provide additional current when the dominant state $S_D$ is reached, so that the LV NMOS transistor M11 is pulled fully open (see t2 in FIG. 2). Similarly, the discharge circuitry 600 may provide extra current when the driver 2 goes from dominant state $S_D$ to recessive state $S_R$ (see t3 and t4 in FIG. 2).

As is illustrated in FIGS. 4-12, in an exemplary embodiment, the feedback circuitry 200 comprises copy circuitry 210 configured to obtain at least one copy signal representative for a signal on the bus node, filter circuitry 220 configured to low-pass filter the at least one copy signal, and derivative circuitry 230 configured to obtain at least one derivative signal representative for the speed, i.e. the rate, at which the signal on the bus node LIN varies based on the at least one filtered signal.

Figure 4:
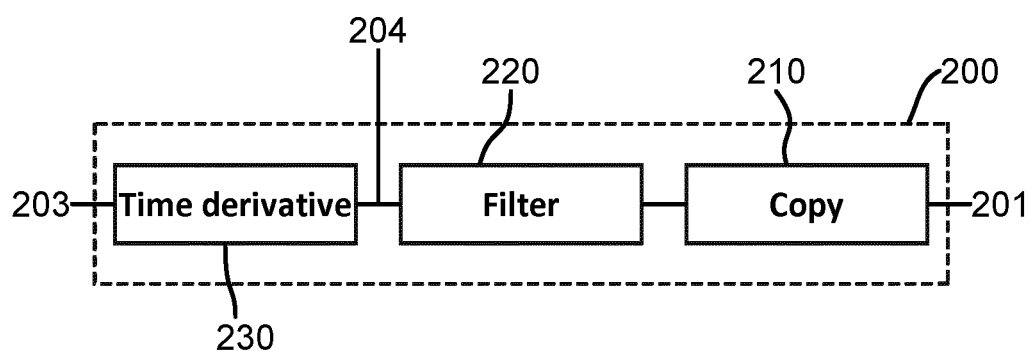
FIGS. 4-12 are block diagrams of various exemplary embodiments of feedback circuitry of a driver.

A first implementation of the feedback circuitry 200 is represented in FIG. 4. The feedback circuitry 200 has an input 201 to be coupled to the shared bus 1 (see also FIG. 3A, 3B) and an output 203 to be coupled to the mixing circuitry 300 (see also FIG. 3A, 3B). Additionally the feedback circuitry 200 may have an output 204 to be coupled to the receiver circuitry 400.

The copy circuitry 210 is configured to obtain a copy signal representative for a signal on the bus node LIN in order to take a robust copy of the bus signal $V_{LIN}$. Preferably, the copy circuitry 210 is configured to sense a voltage on the bus node LIN and to cause a transition thereof into a copy current constituting the copy signal. This may be done using a resistor between the supply node Vbat and the bus node LIN and/or using a resistor between the bus node LIN and the ground GND.

Preferably, the current flowing through the resistor is further copied using a current mirror. Thus, the copy current constituting the copy signal may be the current output by the current mirror or the current flowing through the resistor if no current mirror is present. More preferably, the copy circuitry 210 is configured such that a leakage current flowing from the bus node LIN into the copy circuitry 210 is less than 20 microampere, and/or such that an equivalent capacitance of the copy circuitry 210 as seen from the bus node LIN is less than 250 pF. The advantage of such copy circuitry 210 is that the load on the bus 1 will be limited and the load to the filter circuitry 220 is known by design. If no copy circuitry would be present, the load of the filter circuitry 220 would depend on the bus 1 which has a variable load depending on the amount and type of the different slaves on the bus 1.

The filter circuitry 220 is configured to low-pass filter the copy signal output by the copy circuitry 210. The filter circuitry 220 is configured to remove disturbances such as RF components. The filtered signal is delivered to a time derivative circuitry 230 and may also be delivered to the receiver circuitry 400. It is noted that the frequency range of the bus signals on the shared bus 1 is much smaller than that of the RF disturbance signals, such that the low-pass filter can effectively filter out the RF disturbance signals. For example, when the driver is connected to a LIN bus, the LIN frequency is typically between 10 kHz and 100 kHz, and the RF disturbance frequency tends towards 1 MHz and higher. The filter circuitry 220 may comprise a low-pass filter with a cut-off frequency between 100 kHz and 900 kHz, more preferably between 120 kHz and 300 kHz, e.g. approximately 150 kHz.

The derivative circuitry 230 is configured to obtain a derivative signal representative for the speed at which the signal on the bus node LIN varies, based on the filtered signal. The time derivative circuitry 230 will take a time-derivative of the filtered signal, which will be an indication of the slope of the signal on the bus node LIN. The output 203 of the derivative circuitry 230 is a current (or voltage) depending on the slope of the signal on the bus node LIN. Within the mixing circuitry 300 (see FIG. 3A, 3B), this current will be mixed with a current generated by the LV gate bias current 500. If the signal slope of the signal on the bus node LIN is too fast, the output 203 of the derivative circuitry 230 will be higher and more current will be subtracted from the bias current generated by the LV gate bias circuitry 500. If the signal slope of the signal on the bus node LIN is too slow, the output 203 of the derivative circuitry 230 will be lower and less current will be subtracted from to the bias current generated by the LV gate bias circuitry 500.

Figure 5:
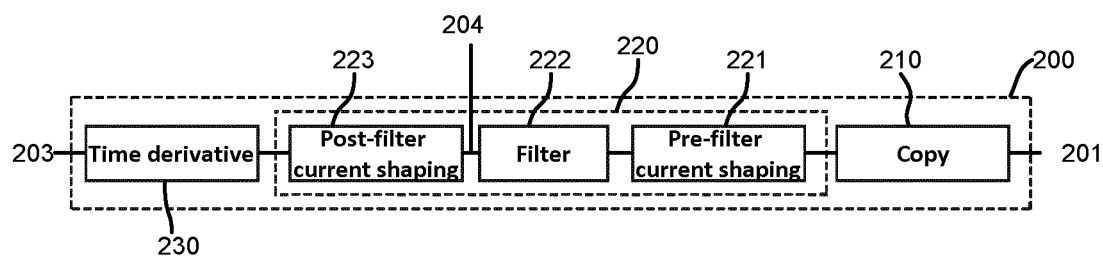

A second implementation of the feedback circuitry 200 is presented in FIG. 5. The filter circuitry 220 comprises a low-pass filter 222, a pre-filter current shaping circuit 221 between the copy circuitry 210 and the low-pass filter 222, and a post-filter current shaping circuit 223 between the low-pass filter 222 and the derivative circuitry 230. The receiver circuitry 400 may be connected to an output of the low-pass filter 222 (as shown) or to an output of the post-filter current shaping circuit 223 (not shown). Optionally, there may be provided an additional current shaping circuit (not shown) in a connection line between the output 204 and the receiver circuitry 400, wherein the additional current shaping circuit (not shown) may be optimized for the receiver circuitry 400. Note that although both pre-filter current shaping and post-filter current shaping circuits 221, 223 are shown in FIG. 5, it is also possible to have only one of the two shaping circuits. The current shaping circuits 221, 223 are introduced to change the available current range to another more suitable range. For example, the current delivered after the copy circuitry 210 will have a minimum and maximum value. These values may not be the optimal value range for the filter 222, so the current may be scaled to the optimal minimum and maximum value for optimal operation of the filter 222. Similarly, the current may be scaled after the filter 222 for obtaining an optimal current range for the time derivative circuitry 230.

Figure 6:
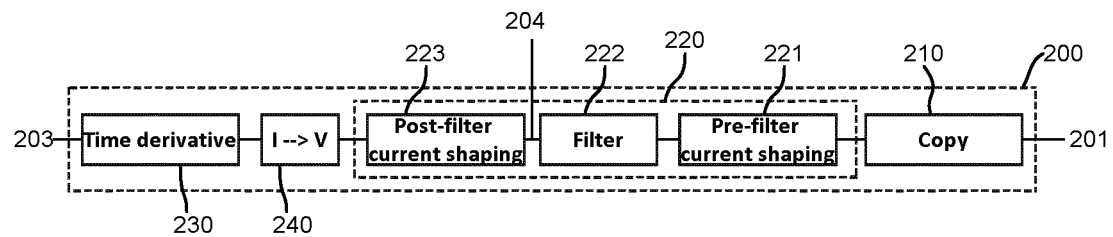
Figure 7:
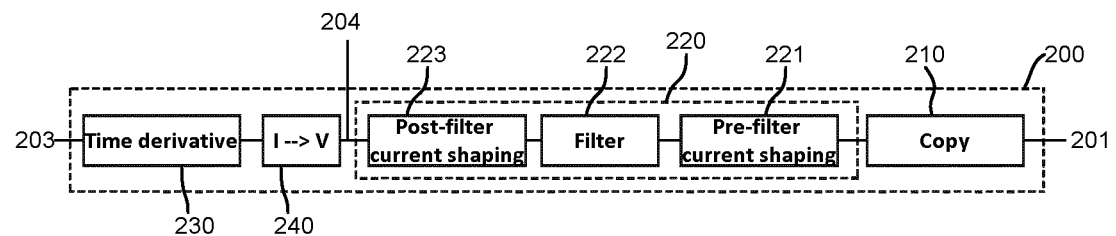
Figure 8:
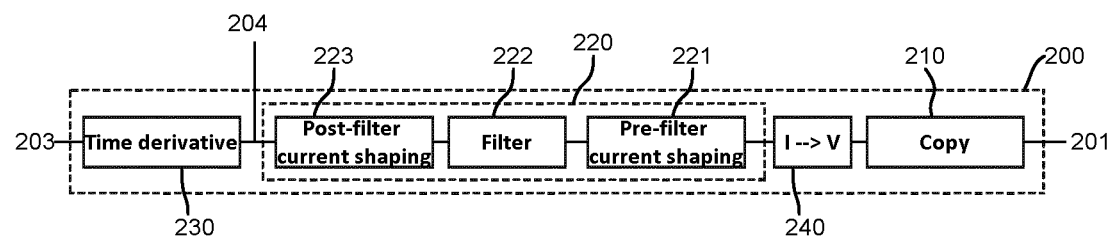

FIGS. 6-8 show further possible implementations of the feedback circuitry 200.

In the embodiment of FIGS. 6 and 7 the copy circuitry 210 is configured to obtain a copy current signal representative for a signal on the bus node, and the feedback circuitry 200 comprises a current-to-voltage converter 240 configured to convert the filtered copy current signal into a voltage signal. The current-to-voltage converter 240 is arranged between the filter circuitry 220 and the derivative circuitry 230.

In the embodiment of FIG. 8 the feedback circuitry 200 comprises a current-to-voltage converter 240 configured to convert the copy current signal (before filtering) into a voltage signal, and this voltage signal is then low-pass filtered by filter circuitry 220. The current-to-voltage converter 240 is arranged between the copy circuitry 210 and the filter circuitry 220.

Figure 9:
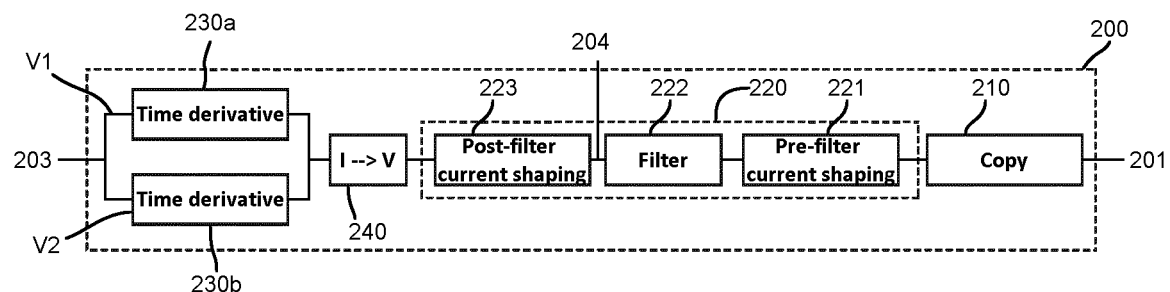

A further embodiment is shown in FIG. 9. The derivation of the filtered signal can be done with two derivation circuits, one for the falling edge and one for the rising edge. In that manner clipping of the filtered signal can be prevented. The derivative circuitry 230 comprises a first derivative circuitry 230a configured to obtain a first derivative signal V1 representative for a rising slope of the signal on the bus node based on the filtered signal, and a second derivative circuitry 230b configured to obtain a second derivative signal V2 representative for a falling slope of the signal on the bus node based on the filtered signal.

Figure 10:
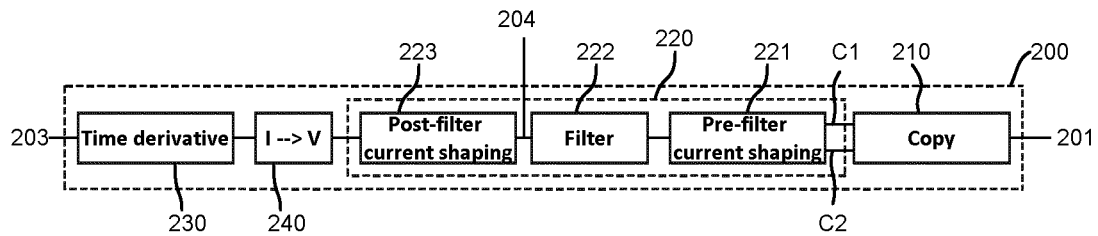

In another embodiment illustrated in FIG. 10, the copy of the signal on the bus node LIN can be done in with two copies. If only one copy is taken clipping of the signal may occur when Vbat or GND is reached. To prevent this, two copied signals C1, C2 may be used: one signal will have no clipping when the voltage on the bus reaches GND, and one will not have clipping when Vbat is reached. After the copy circuitry 210, both signals may be merged again. The copy circuitry 210 may comprise a first copy circuit between the bus node LIN and the supply node Vbat generating the first copy signal C1, and a second copy circuit between the bus node LIN and the ground node GND generating the second copy signal C2. The filter circuitry 220 is then configured for filtering both said first and said second copy signals C1, C2.

Figure 11:
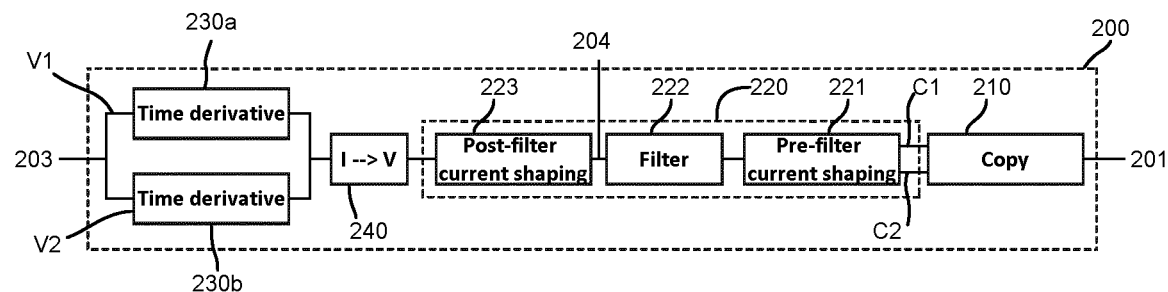

FIG. 11 illustrates a further embodiment combining the features of the embodiment of FIG. 9 and FIG. 10.

Figure 12:
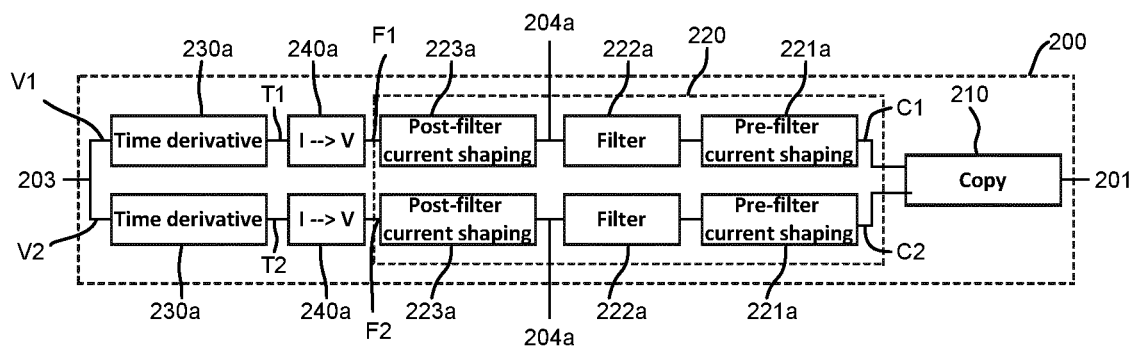

FIG. 12 illustrates yet another embodiment combining the features of the embodiment of FIG. 9 and FIG. 10, but wherein also the filter circuitry 220 and the current-to-voltage converter 240 have been split in two branches: the two copied signals C1, C2 are provided to respective branches 221a, 222a, 223a and 221b, 222b, 223b in order to obtain respective filtered signals F1, F2; the two filtered signals F1, F2 are provided to respective current-to-voltage converters 240a, 240b in order to obtain respective voltage signals T1, T2, and those voltage signals T1, T2 are provided to the respective first and second derivative circuitry 230a, 230b.

Figure 13A:
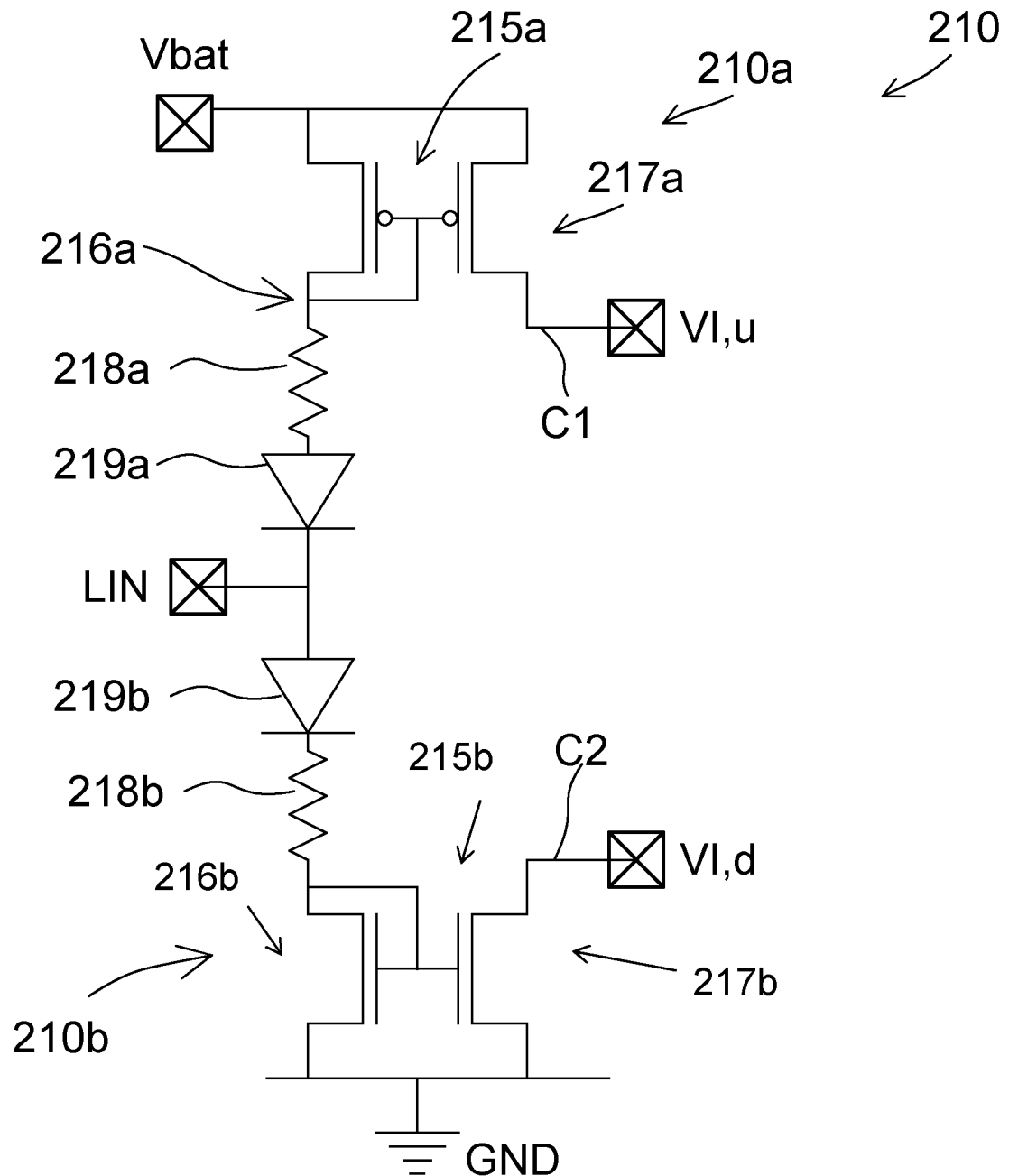
FIGS. 13A, 13B, 13C are circuit diagrams of various exemplary embodiments of copy circuitry.
Figure 13B:
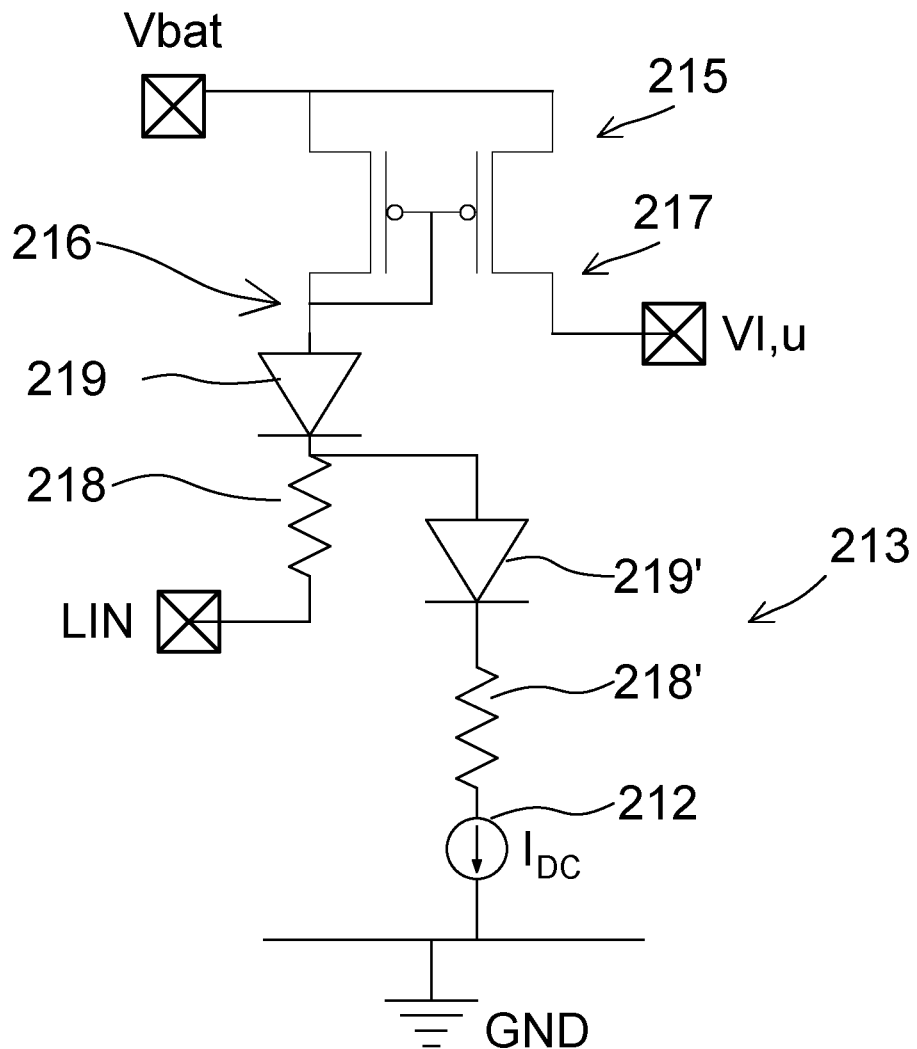
Figure 13C:
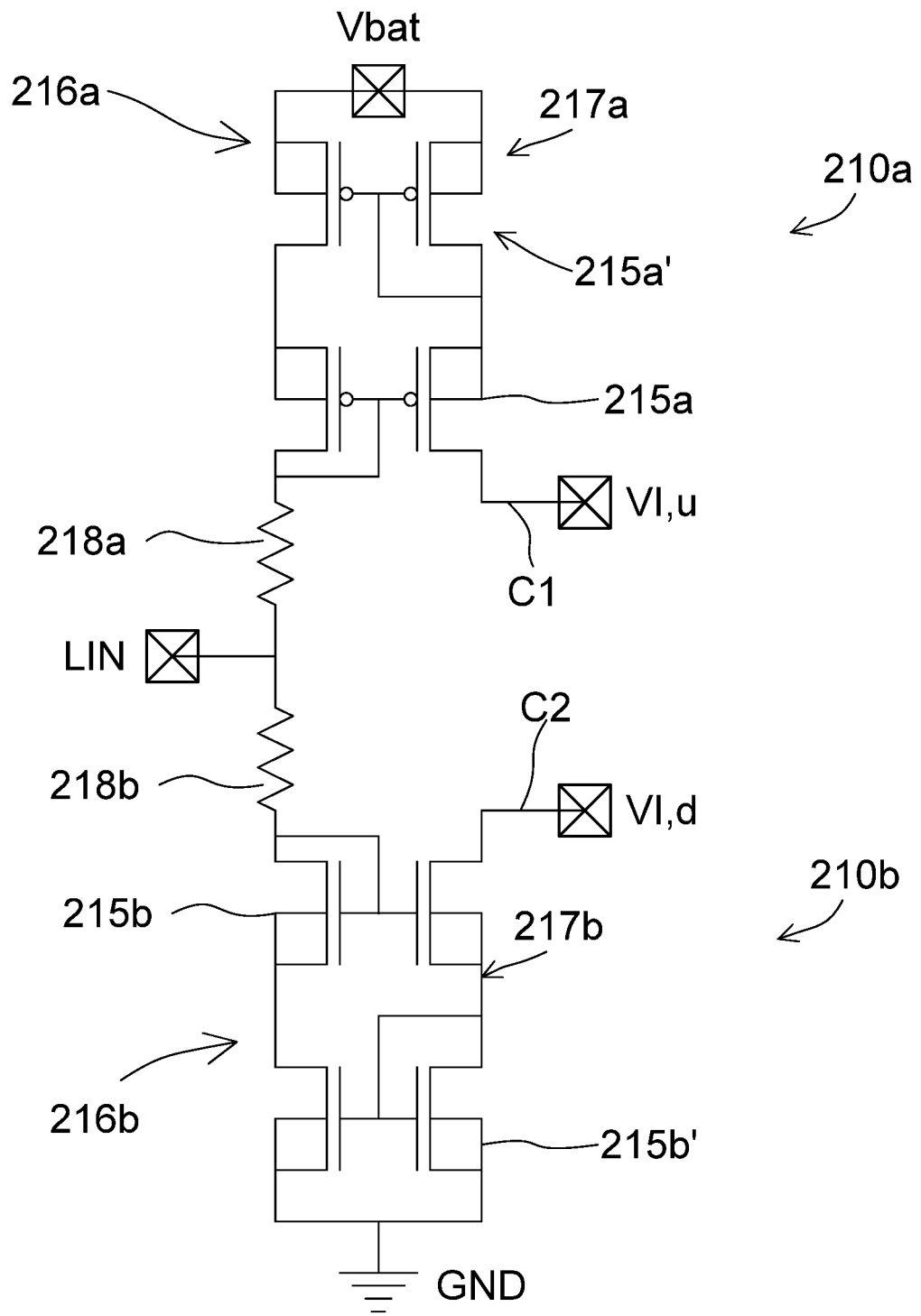

FIGS. 13A-13C illustrate different embodiments of copy circuitry 210.

In the embodiment of FIG. 13A, the copy circuitry 210 comprises a first copy circuit 210a between the bus node LIN and the supply node Vbat generating a first copy signal C1, and a second copy circuit 210b between the bus node LIN and the ground node GND generating a second copy signal C2. The first copy circuit 210a comprises a first current mirror 215a with a first branch 216a between the bus node LIN and the supply node Vbat, and with a second branch 217a generating a first mirror current C1 at a first output V1, u. The first branch 216a further comprises a resistor 218a and a diode 219a. Similarly, the second copy circuit 210b comprises a second current mirror 215b with a first branch 216b between the bus node LIN and a ground node GND and with a second branch 217b generating a second mirror current C2. The first branch 216b further comprises a resistor 218b and a diode 219b. The first copy circuit 210a between the bus node and the supply node Vbat will be able to copy voltages below Vbat−Vth, wherein Vth is the sum of the threshold voltage of a transistor of the current mirror 215a and the forward voltage of the diode 219a. The second copy circuit 210b between the supply node Vbat and the ground node GND will be able to copy voltages above Vth, wherein Vth is the sum of the threshold voltage of a transistor of the current mirror 215b and the forward voltage of the diode 219b. By having both the first and the second copy circuit 210a, 210b all voltage levels can be copied.

In the embodiment of FIG. 13B, the copy circuitry 210 comprises a current mirror 215 with a first branch 216 between the bus node LIN and the supply node Vbat, and with a second branch 217 generating a mirror current C at an output V1, u. The first branch 216 further comprises a resistor 218 and a diode 219. An additional branch 213 is provided for conducting current from the bus node LIN to ground GND when the bus node LIN is high: the additional branch 213 is connected between ground GND and an intermediate node between resistor 218 and diode 219. The additional branch 213 comprises a current source 212 and optionally a further resistor 218' and diode 219'. By providing the additional branch 213 the voltage range than can be copied is not limited by Vbat−Vth.

In the embodiment of FIG. 13C, the copy circuitry 210 comprises a first copy circuit 210a between the bus node LIN and the supply node Vbat generating a first copy signal C1, and a second copy circuit 210b between the bus node LIN and the ground node GND generating a second copy signal C2. The first copy circuit 210a comprises a first double current mirror 215a, 215a' with a first branch 216a between the bus node LIN and the supply node Vbat, and with a second branch 217a generating a first mirror current C1 at a first output V1, u. The first branch 216a further comprises a resistor 218a. Similarly, the second copy circuit 210b comprises a second double current mirror 215b, 215b' with a first branch 216b between the bus node LIN and a ground node GND and with a second branch 217b generating a second mirror current C2. The first branch 216b further comprises a resistor 218b. By providing "double" current mirrors the accuracy of the copy circuitry 210 can be further improved.

The embodiments of FIGS. 13A-13C allow obtaining a good copy (either one copy signal C, or two copy signals C1, C2) regardless of the state of the bus node LIN and the impact on the shared bus e.g. in terms of load and leakage will be limited.

Figure 14A:
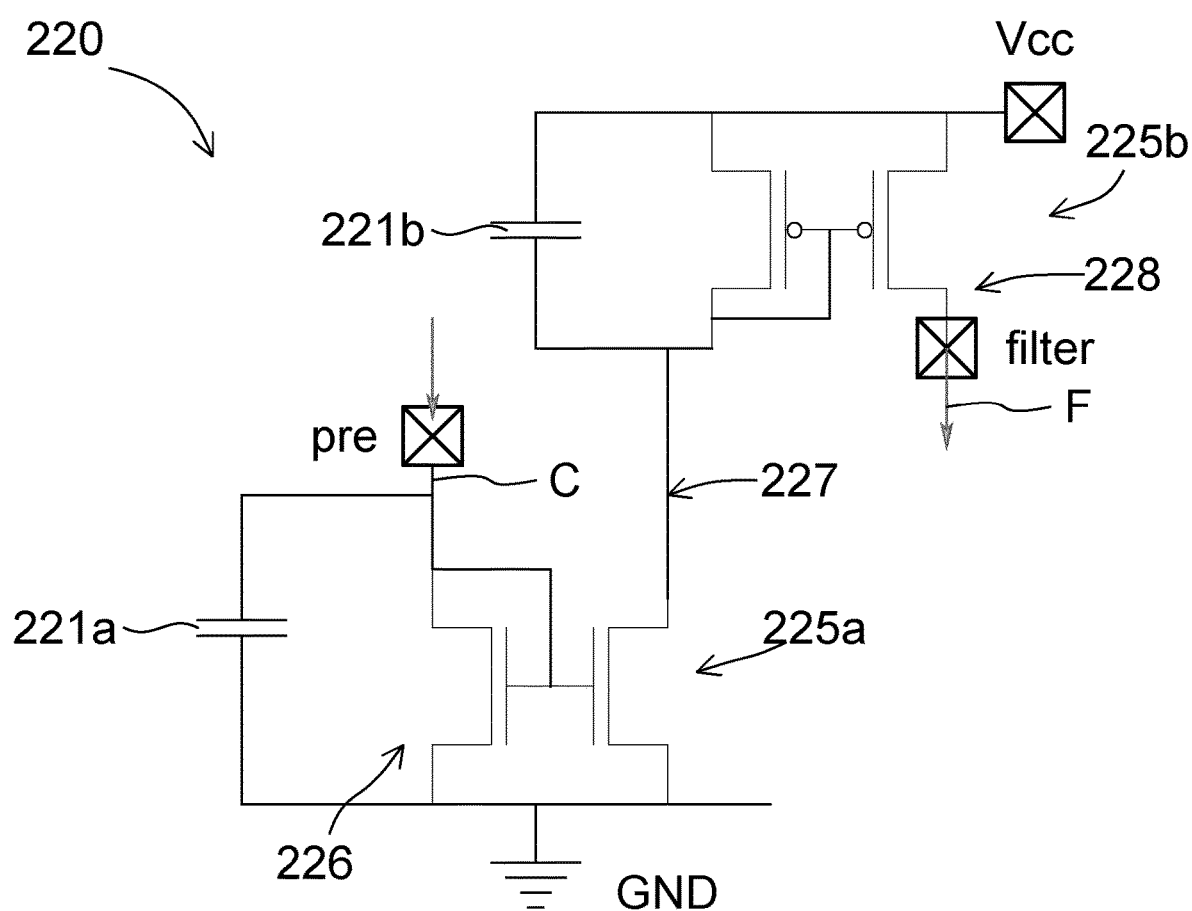
FIGS. 14A and 14B are circuit diagrams of various exemplary embodiments of filter circuitry.
Figure 14B:
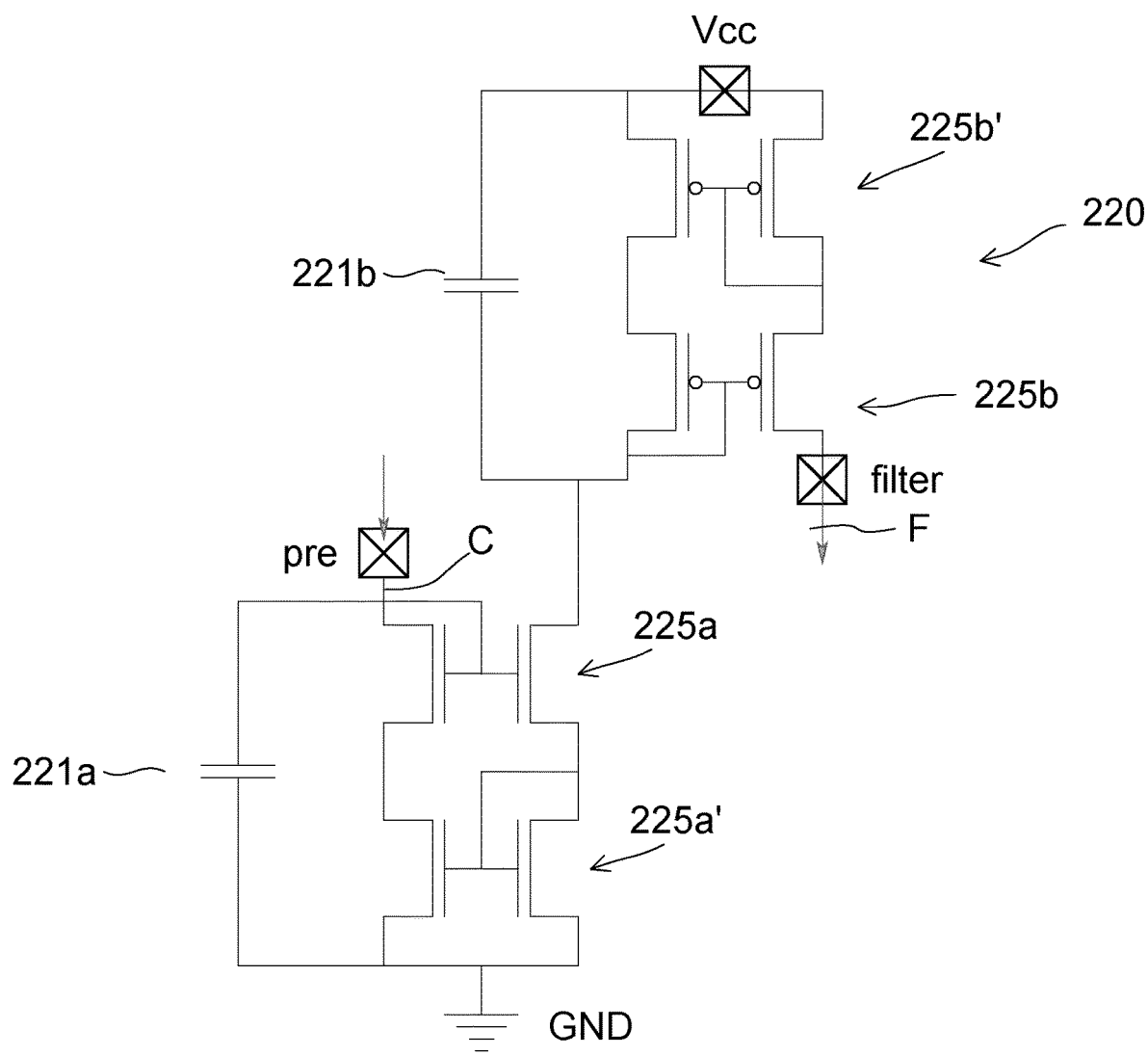

FIGS. 14A and 14B illustrate possible embodiments of the filter circuitry 220.

In the embodiment of FIG. 14A, the filter circuitry 220 comprises a first current mirror 225a with a first branch 226 between an input pin receiving a copy signal C (optionally this may be a shaped copy signal C) and the ground GND, and with a second branch which is part of a common branch 217 containing also a first branch of a second current mirror 225b. The common branch 217 extends between the ground GND and a DC supply voltage Vcc. This DC supply voltage Vcc is different from the supply voltage Vbat connected to the supply node of the driver. The DC supply voltage Vcc may be e.g. a 5V DC supply voltage. The DC supply voltage Vcc may be generated based on the supply voltage Vbat (typically a battery voltage, e.g. between 5V and 20V). Alternatively, the DC supply voltage Vcc may originate from a separate power source. The possibility to use such a DC supply voltage Vcc is also one of the advantages which is a consequence of using copy circuitry 210; indeed, by using copy circuitry 210, the further circuitry (i.e. the filter circuitry 220, the derivative circuitry 230, and the mixing circuitry 300) can be made in the LV domain, resulting in less noise and the possibility to use LV transistors. The second current mirror 225b comprises a second branch 228 extending between the DC supply voltage Vcc and an output pin "filter", and generates a filter output signal F in said second branch 228. The first branch 216 of the first current mirror 225a is connected in parallel with a capacitor 221a. The first branch of the second current mirror 225b is connected in parallel with a capacitor 221b. The filtering is mainly determined by the parallel connection of the equivalent resistance of the current mirror 225a and the capacitor 221a, on the one hand, and by the parallel connection of the equivalent resistance of the current mirror 225b and the capacitor 221b, on the other hand. The values of the capacitors 221a, 221b may be chosen to obtain an appropriate filtering.

The embodiment of FIG. 14B is similar to the embodiment of FIG. 14A with this difference that the current mirrors are implemented as double current mirrors 225a, 225a' and 225b, 225b'.

Figure 15:
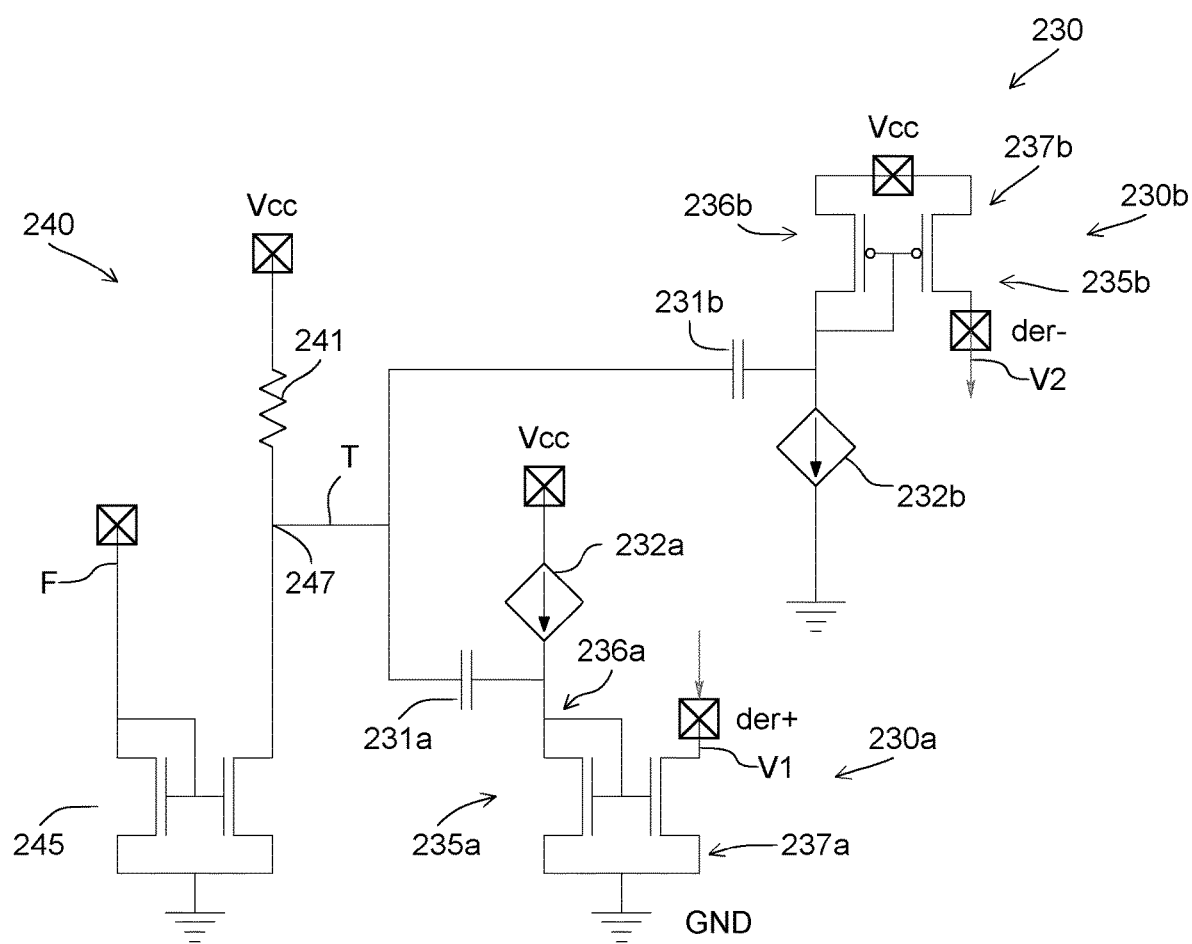
FIG. 15 is a circuit diagram of an exemplary embodiment of derivative circuitry.

FIG. 15 is a circuit diagram of an exemplary embodiment of a current-to-voltage circuitry 240 and derivative circuitry 230. The derivative circuitry 230 comprises a first derivative circuit 230a between the output node 247 of current-to-voltage circuitry 240 and a first output node der+ generating a first derivative signal V1, and a second derivative circuit 230b between the output node 247 and a second output node der− generating a second derivative signal V2. The first derivative circuit 230a comprises a first current mirror 225a with a first branch 236a and with a second branch 237a in which the first derivative signal V1 is generated. The first derivative circuit 230a comprises a capacitor 231a connected between the output node 247 and the first branch 236a, and a current source 232a connected to a DC supply voltage Vcc to generate a DC current in the first branch 236a. This DC current is varied depending on the signal on node 247 through the capacitor 231a. Similarly, the second derivative circuit 230b comprises a first current mirror 225b with a first branch 236b and with a second branch 237b in which the second derivative signal V2 is generated. The second derivative circuit 230b comprises a capacitor 231b connected between the output node 247 and the first branch 236b, and a current source 232b connected to the ground GND to generate a DC current in the first branch 236b. This DC current is varied depending on the signal on node 247 through the capacitor 231b.

Figure 16A:
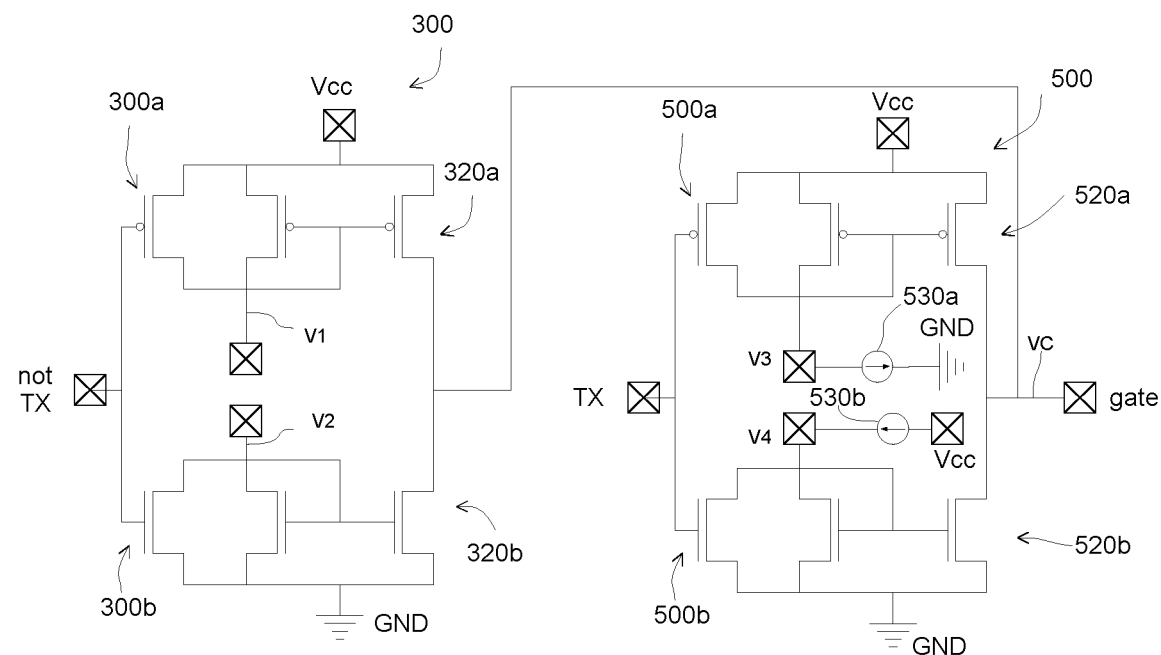
FIGS. 16A and 16B are circuit diagrams of various exemplary embodiments of a mixing circuitry and gate bias circuitry.
Figure 16B:
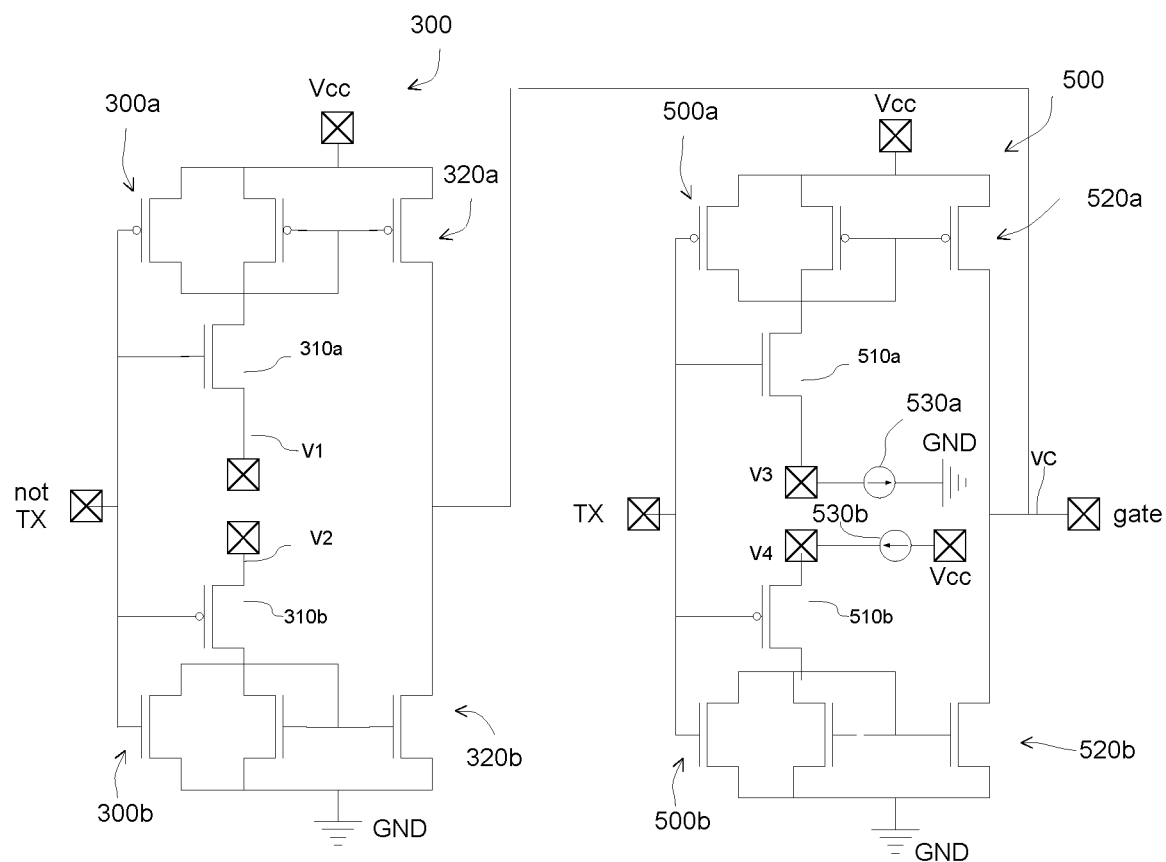

FIGS. 16A and 16B are circuit diagrams of various exemplary embodiments of a mixing circuitry 300 and a gate bias circuitry 500. The mixing circuitry 300 comprises a pull-up circuit 300*a* with a current mirror 320*a* and a pull-down circuit 300*b* with a current mirror 320*b*. Similarly, the gate bias circuitry 500 comprises a pull-up circuit 500*a* with a current mirror 520*a* and a pull-down circuit 500*b* with a current mirror 520*b*. The mixing circuitry 300 receives a signal "not TX" to activate either the pull-up circuit 300*a* or the pull-down circuit 300*b*. The gate bias circuitry 500 receives a signal "TX" to activate either the pull-up circuit 500*a* or the pull-down circuit 500*b*. The input voltage on the TX and "not TX" may be high or low, enabling the pullup-up circuit 300*a*, 500*a* or pull up circuit 300*b*, 500*b*. Pull-up circuit 300*a* 500*a* will enable or disable the current mirror 320*a*, 520*a*. The pull-down circuit 300*b*, 500*b* will enable or disable the current mirror 320*b*, 500*b*. The current mirror 320*a* receives a first derivative signal V1 output by the derivative circuitry 230 (see also FIG. 15). The current mirror 320*b* receives a second derivative signal V2 output by the derivative circuitry 230 (see also FIG. 15). The current mirror 520*b* receives a first DC current 530*a* and the current mirror 520*b* receives as a second DC current 530*b*.

When "TX" is high, the bias current Ibias generated by the gate bias circuitry 500 will be positive such that the bias current flows towards the gate. The mixing circuitry 300 generates a current Icor which is opposite to the bias current Ibias, resulting in a corrected current following towards the gate with a value |Ibias|−|Icor|. Pull-down circuit 500*b* will disable current mirror 520*b* and the current mirror 520*a* will be enabled, resulting in current flow towards the gate. Pull-up circuit 300*a* will disable current mirror 320*a* ("not TX" will be low) and enable current mirror 520*b*, resulting in current flow from the gate towards the ground If the signal slope of the signal on the bus node LIN is too fast, more current |Icor| will be subtracted from the bias current |Ibias|. If the signal slope of the signal on the bus node LIN is too slow, less current |Icor| will be subtracted from the bias current |Ibias|.

When "TX" is low, the bias current Ibias generated by the gate bias circuitry 500 will be negative such that the bias current flows from the gate into the gate bias circuitry 500. The mixing circuitry 300 generates a current Icor which is opposite to the bias current Ibias, resulting in a corrected current following out of the gate with a value |Ibias|−|Icor|. Pull-up circuit 500*a* will disable current mirror 520*a* and the current mirror 520*b* will be enabled, resulting in current flow from the gate to ground. Pull-up circuit 300*b* will disable current mirror 320*a* ("not TX" will be high) and enable current mirror 520*a*, resulting in current flow towards the gate. Again, if the signal slope of the signal on the bus node LIN is too fast, more current |Icor| will be subtracted from the bias current |Ibias|. If the signal slope of the signal on the bus node LIN is too slow, less current |Icor| will be subtracted from the bias current |Ibias|.

In the embodiment of FIG. 16B the mixing circuitry 300 further comprises an interrupt transistor 310*a* in series with the pull-up circuit 300*a* and an interrupt transistor 310*b* in series with the pull-down circuit 300*b*. Similarly, the gate bias circuitry 500 further comprises a interrupt transistor 510*a* in series with the pull-up circuit 500*a* and an interrupt transistor 510*b* in series with the pull-down circuit 500*b*. Those interrupt transistors 310*a*, 310*b*, 510*a*, 510*b* will allow switching off a current path when the respective branch is not being used, so that any leakage currents are further reduced.

Other exemplary embodiments relate to a local interconnect network comprising a shared bus and a plurality of drivers. One or more drivers of said plurality of drivers may be implemented as described above in connection with the figures, wherein each driver is connected with its bus node to the shared bus. One driver of said plurality of drivers may be configured to function as a master, and one or more other drivers thereof may be configured to function as one or more slaves.

The current mirrors illustrated in this application may be replaced by alternative implementations (for example a single current mirror may be replaced by a double/stacked current mirror, see for example the current mirrors used in FIGS. 13A and 13C.

Further, the skilled person will understand that the bulk of the MOS transistors used in this application may be coupled to the source of the transistor or alternatively to a power supply (GND, VSS, substrate for NMOS transistor, VDD for PMOS transistor).

Whilst the principles of the invention have been set out above in connection with specific embodiments, it is to be understood that this description is merely made by way of example and not as a limitation of the scope of protection which is determined by the appended claims.

The invention claimed is:

1. A driver for insertion between a shared bus and a logic device, said driver having a supply node for connection to a voltage supply, a bus node for connection to the shared bus, a transmit data input node and a receive data output node, said driver comprising:
   pull-up circuitry coupled between the supply node and the bus node,
   driver circuitry configured to draw a current from the shared bus as a function of a signal on the transmit data input node, said driver circuitry having a control input connected to the transmit data input node,
   feedback circuitry configured to provide feedback from the shared bus to the control input of the driver circuitry;
   wherein said feedback circuitry comprises:
   copy circuitry configured to output at least one copy signal representative of a signal on the bus node,
   filter circuitry configured to low-pass filter the at least one copy signal to output at least one filtered signal,
   derivative circuitry configured to output at least one derivative signal representative of a speed at which the signal on the bus node varies based on the at least one filtered signal.

2. The driver according to claim 1, wherein the pull-up circuitry comprises a diode and a resistor connected in series.

3. The driver according to claim 1, further comprising mixing circuitry configured to mix the at least one derivative signal with an input signal representative of the signal on the transmit data input node to provide a corrected signal to the control input of the driver circuitry.

4. The driver according to claim 3, wherein the mixing circuitry is configured to generate the input signal as a positive or a negative current depending on a level of the signal on the transmit data input node.

5. The driver according to claim 1, wherein the feedback circuitry is connected to the receive data output node such that the at least one filtered signal or a signal representative of said at least one filtered signal is provided at the receive data output node.

6. The driver according to claim 1, wherein the driver circuitry comprises a series connection of a low voltage transistor, a high voltage transistor and a diode, wherein the low voltage transistor has the control input.

7. The driver according to claim 1, wherein the copy circuitry comprises at least one current mirror circuit.

8. The driver according to claim 1, wherein the copy circuitry comprises:
  a first current mirror including:
    a first branch coupled between the bus node and the supply node, and
    a second branch configured to generate a first mirror current; and
  a second current mirror including:
    a first branch coupled between the bus node and a ground node, and
    a second branch configured to generate a second mirror current;
  wherein the filter circuitry is configured to filter both said first and said second mirror current.

9. The driver according to claim 1, wherein at least one of:
  a leakage current flowing from the bus node into the copy circuitry is less than 20 microampere;
  an equivalent capacitance of the copy circuitry as seen from the bus node is less than 250 pF.

10. The driver according to claim 1, wherein the copy circuitry is configured to:
  sense a voltage on the bus node; and
  transform the voltage into at least one copy current constituting the at least one copy signal.

11. The driver according to claim 1, wherein the derivative circuitry is configured to output the at least one derivative signal by performing a derivation in time of the at least one filtered signal, wherein the output of the derivative circuit is a current or a voltage of which its value depends on a slope of the signal on the bus node.

12. The driver according to claim 1, wherein the filter circuitry comprises a low-pass filter and at least one of: a pre-filter shaping circuit coupled between the copy circuitry and the low-pass filter, or a post-filter shaping circuit coupled between the low-pass filter and the derivative circuitry;
  wherein the receive data output node is connected to at least one of: an output of the low-pass filter or an output of the post-filter shaping circuit.

13. The driver according to claim 1, wherein the copy circuitry is configured to output at least one copy current signal representative of the signal on the bus node, wherein the feedback circuitry comprises a current-to-voltage converter configured to convert the at least one copy current signal into at least one voltage signal, wherein said current-to-voltage converter is coupled between the filter circuitry and the derivative circuitry or is coupled between the copy circuitry and the filter circuitry.

14. The driver according to claim 1, wherein the derivative circuitry comprises:
  a first derivative circuitry configured to output a first derivative signal representative of a rising slope of the signal on the bus node based on the at least one filtered signal; and
  a second derivative circuitry configured to output a second derivative signal representative of a falling slope of the signal on the bus node based on the at least one filtered signal.

15. The driver according to claim 1, wherein the feedback circuitry is implemented in metal oxide semiconductory (MOS) technology.

16. A local interconnect network comprising a shared bus and a plurality of drivers comprising at least one driver according to claim 1, wherein the bus node of said at least one driver is connected to the shared bus.

17. A driver for insertion between a shared bus and a logic device, said driver having a supply node for connection to a voltage supply, a bus node for connection to the shared bus, a transmit data input node and a receive data output node, said driver comprising:
  pull-up circuitry coupled between the supply node and the bus node,
  driver circuitry configured to draw a current from the shared bus as a function of a signal on the transmit data input node, said driver circuitry having a control input connected to the transmit data input node,
  feedback circuitry configured to provide feedback from the shared bus to the control input of the driver circuitry;
  wherein said feedback circuitry comprises filter circuitry configured to low-pass filter at least one signal representative for a signal on the bus node to output at least one filtered signal,
  wherein the feedback circuitry is connected to the receive data output node such that the at least one filtered signal or a signal representative of for said at least one filtered signal is provided at the receive data output node.

18. The driver according claim 17, wherein the pull-up circuitry comprises a diode and a resistor connected in series.

19. The driver according to claim 18, wherein the feedback circuitry further comprises copy circuitry configured to output at least one copy signal representative of the signal on the bus node, and wherein the copy circuitry is connected to the filter circuitry to provide said at least one copy signal to an input of the filter circuitry.

20. The driver according to claim 17, further comprising derivative circuitry configured to output at least one derivative signal representative of a speed at which the signal on the bus node varies based on the at least one filtered signal.

21. The driver according to claim 20, further comprising mixing circuitry configured to mix the at least one derivative signal with the signal on the transmit data input node to provide a corrected signal to the control input of the driver circuitry.

22. A driver for insertion between a shared bus and a logic device, said driver having a supply node for connection to a voltage supply, a bus node for connection to the shared bus, a transmit data input node and a receive data output node, said driver comprising:
  pull-up circuitry coupled between the supply node and the bus node,
  driver circuitry configured to draw a current from the shared bus as a function of a signal on the transmit data input node, said driver circuitry having a control input connected to the transmit data input node,
  feedback circuitry configured to provide feedback from the shared bus to the control input of the driver circuitry;
  wherein said driver circuitry comprises a series connection of a low voltage transistor, a high voltage transistor and a diode, wherein the low voltage transistor has the control input.

23. The driver according to claim 22, wherein the pull-up circuitry comprises a diode and a resistor connected in series.

24. The driver according to claim 22, wherein the low voltage transistor is a low voltage metal oxide semiconductor field effect transistor (MOSFET), and the high voltage transistor is a high voltage MOSFET, wherein a gate of the high voltage MOSFET is connected directly or indirectly to a DC voltage supply.

25. The driver according to claim 24, wherein a control input of the high voltage transistor is coupled to a push-pull circuit coupled between the supply node and ground, wherein an output of the push-pull circuit is set by the DC voltage supply.

26. The driver according to claim 22, wherein a control input of the high voltage transistor is connected to a capacitor configured to drain away RF signals.

* * * * *